(12) United States Patent
Jun

(10) Patent No.: US 6,194,964 B1
(45) Date of Patent: Feb. 27, 2001

(54) PREDISTORTER HAVING AN AUTOMATIC GAIN CONTROL CIRCUIT AND METHOD THEREFOR

(75) Inventor: Min-sik Jun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/346,031

(22) Filed: Jul. 1, 1999

(30) Foreign Application Priority Data

Jul. 7, 1998 (KR) .................................................. 98/27209

(51) Int. Cl.⁷ ...................................................... H03F 1/26
(52) U.S. Cl. ............................................. 330/149; 330/136
(58) Field of Search ..................................... 330/129, 136, 330/149, 284; 375/297

(56) References Cited

U.S. PATENT DOCUMENTS

| | | | |
|---|---|---|---|
| 5,770,971 | 6/1998 | McNicol | 330/52 |
| 5,892,397 | 4/1999 | Belcher et al. | 330/149 |
| 5,912,588 | 6/1999 | Nummila | 330/254 |
| 5,963,087 | * 10/1999 | Anderson | 330/136 X |
| 5,963,090 | * 10/1999 | Fukuchi | 330/149 |
| 6,002,300 | * 12/1999 | Herbster et al. | 330/149 |

* cited by examiner

Primary Examiner—Steven J. Mottola
(74) Attorney, Agent, or Firm—Dilworth & Barrese, LLP

(57) ABSTRACT

A predistorter having automatic gain control (AGC) circuit and method therefor are disclosed. The predistorter for a linearizer of a high frequency amplifier includes an automatic gain control circuit for controlling the gain so that all through the high frequency amplifier there is no change of gain when an output signal is changed as a result of comparing the input signal to the output signal of the main amplifier; and a variable attenuator being controlled by the automatic gain control circuit so that all through the high frequency amplifier there is no change of gain by minimizing the change of gain of the combined signal. The method for the predistortion method for a linearizer of a high frequency amplifier includes dividing the input signal into main-path signal and sub-path signal; delaying the phase of the main-path signal; generating harmonic signals using the sub-path signal; attenuating the output signal of the harmonic generator; amplifying the phase of the output signal of a variable attenuator; combining the output signal of the variable phase amplifier with the output signal of the phase shifter; amplifying the combined signal; comparing the input signal with the amplified combined output signal; and controlling the gain of the high frequency amplifier overall using an automatic gain control circuit when the output signal is changed as a result of the comparing.

4 Claims, 3 Drawing Sheets

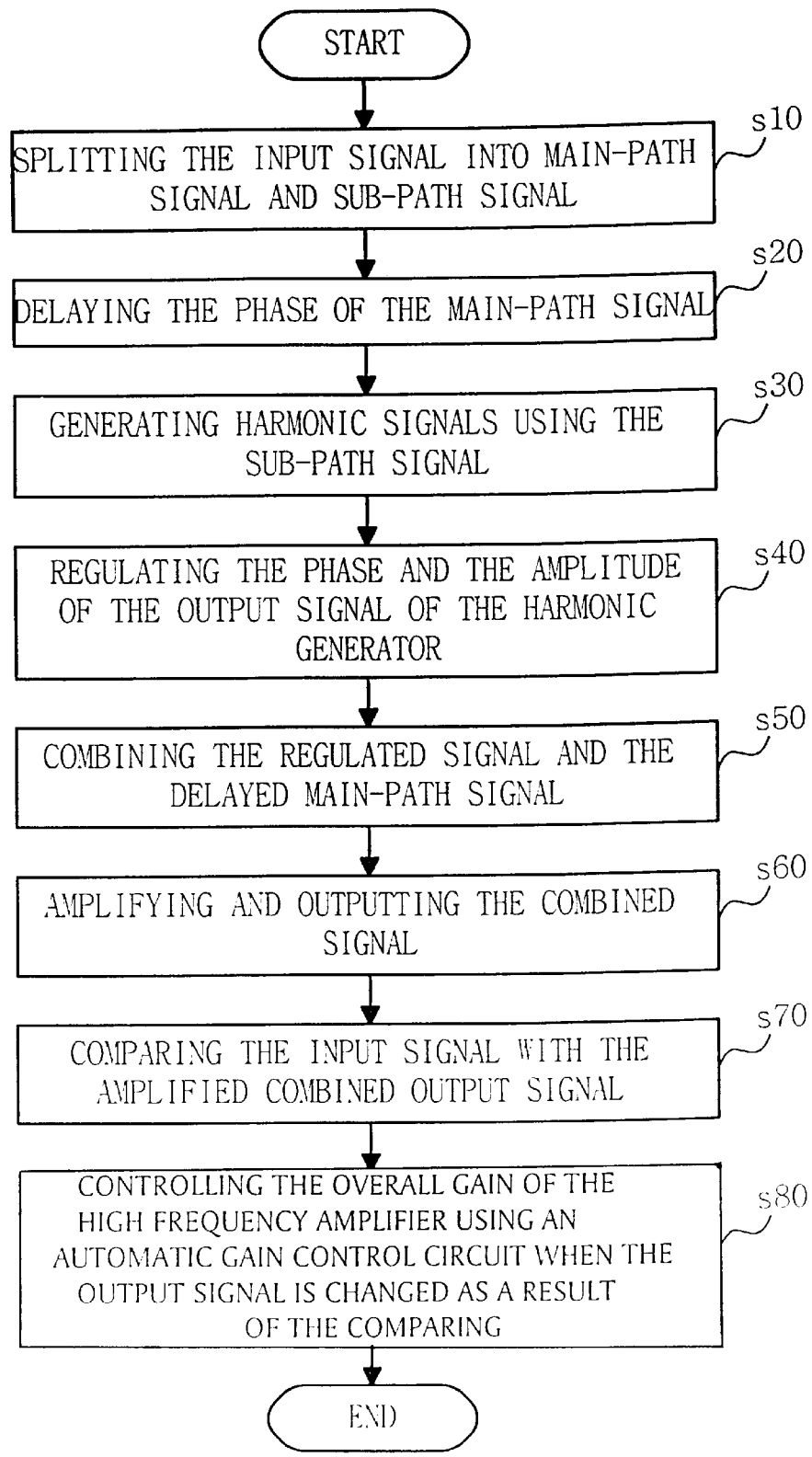

PREDISTORTER HAVING AN AUTOMATIC GAIN CONTROL CIRCUIT AND METHOD THEREFOR

CLAIM OF PRIORITY

This application makes reference to, incorporates the same herein, and claims all benefits accruing under 35 U.S.C. §119 from an application entitled "Predistorter Having Automatic Gain Control Circuit and Method Therefor" earlier filed in the Korean Industrial Property Office on Jul. 7, 1998, and there duly assigned Serial No. 1998-27209.

BACKGROUND OF THE INVENTION

1. Field of the Invention

The present invention relates to a predistorter having an automatic gain control (AGC) circuit and method therefor and, in particular, to a simplified predistorter circuit which lacks a subtraction circuit typically found in a conventional predistorter, and includes an automatic gain controller (AGC) and method therefor.

2. Description of the Related Art

A predistorter is a circuit that minimizes an intermodulation distortion of a main amplifier. This is accomplished by estimating the intermodulation distortion in the main amplifier and adding the predistorted signal to the input signal of the main amplifier.

Referring to FIG. 1, a conventional predistorter comprises a harmonic generator 10 used for the predistortion, and a subtraction circuit 40, which removes all but the spurious components among the signals being generated in the harmonic generator 10, wherein the spurious components contribute to the linearization of the main amplifier. The subtraction circuit 40 aids in canceling the main carrier components being amplified in the harmonic generator 10.

The subtraction circuit 40 receives the input signal via divider 5 and comprises an attenuator 50, a phase shifter 60, a combiner 52 and a divider 51. The gain in the attenuator 50 and the phase shifter 60 is the same, and the phase is inverse, as compared to the gain and phase of the harmonic generator 10.

A first variable attenuator 20 and a variable phase shifter 30 are used to optimize the resulting signal after canceling the main carrier components, thereby minimizing the intermodulation distortion of the main amplifier 80.

However, practically speaking, the subtraction circuit 40 can not completely cancel the main carrier components. In addition, the subtraction is not performed when the frequency band is narrow and the frequency is changed.

As such, a problem occurs in that the gain of amplifier becomes unstable overall when the first variable attenuator 20 and variable phase shifter 30 are operated so as to minimize the intermodulation distortion of the main amplifier. Here, the gain of the overall amplifier is calculated as a gain derived from the predistorter and the main amplifier.

The gain of amplifier also becomes unstable overall because the spurious components power is that of a specific rate over the total signal.

SUMMARY OF THE INVENTION

A preferred embodiment of a predistorter of a high frequency amplifier in accordance with the present invention comprises: an automatic gain control circuit for controlling an overall gain of said high frequency amplifier so that there is no change in the overall gain of the high frequency amplifier when an output signal is changed as a result of comparing an input signal to the output signal of a main amplifier; and a variable attenuator being controlled by the automatic gain control circuit so that there is no change in an overall gain of the high frequency amplifier, thereby minimizing the change of gain of a combined signal; and a linearizer with a signal divider for dividing the input signal into a main-path signal and a sub-path signal, a phase shifter for delaying a phase of the main-path signal, a harmonic generator for generating harmonic signals using the sub-path signal, a second variable attenuator for attenuating an output of the harmonic generator, a variable phase amplifier for amplifying a phase of the output signal of the first variable attenuator, a combiner for combining an output signal of the variable phase amplifier with an output signal of the phase shifter, and a main amplifier for amplifying the combined signal.

A preferred embodiment of a method of predistortion using an automatic gain control circuit for a linearizer of a high frequency amplifier comprises the steps of: dividing an input signal into a main-path signal and a sub-path signal; delaying a phase of the main-path signal; generating harmonic signals with a harmonic generator, the harmonic signals being generated from the sub-path signal; regulating a phase and an amplitude of an output signal of the harmonic generator; combining the regulated output signal and the delayed main-path signal; amplifying and outputting the combined signal; comparing the input signal with the amplified combined output signal; and controlling an overall gain of the high frequency amplifier using the automatic gain control circuit when a change is detected in the amplified combined output signal, the change being detected during comparison with the input signal.

The step of controlling the overall gain of the high frequency amplifier comprises the steps of: minimizing a variation of a gain of the combined signal using the automatic gain control circuit to control a variable attenuator which attenuates said signal; and amplifying and outputting the combined signal so that an intermodulation distortion is suppressed, wherein the variation of the gain of the amplified combined output signal is minimized by the control of the automatic gain control circuit.

BRIEF DESCRIPTION OF THE DRAWINGS

FIG. 3 illustrates a flow chart of a method of predistortion using an automatic gain control circuit for a linearizer of a high frequency amplifier in accordance with the present invention.

DETAILED DESCRIPTION OF THE PREFERRED EMBODIMENTS

In accordance with the present invention, an automatic gain controller (AGC) is used for controlling a variable attenuator where an output signal is changed in magnitude when both an input and an output signal is detected.

Figure 1:
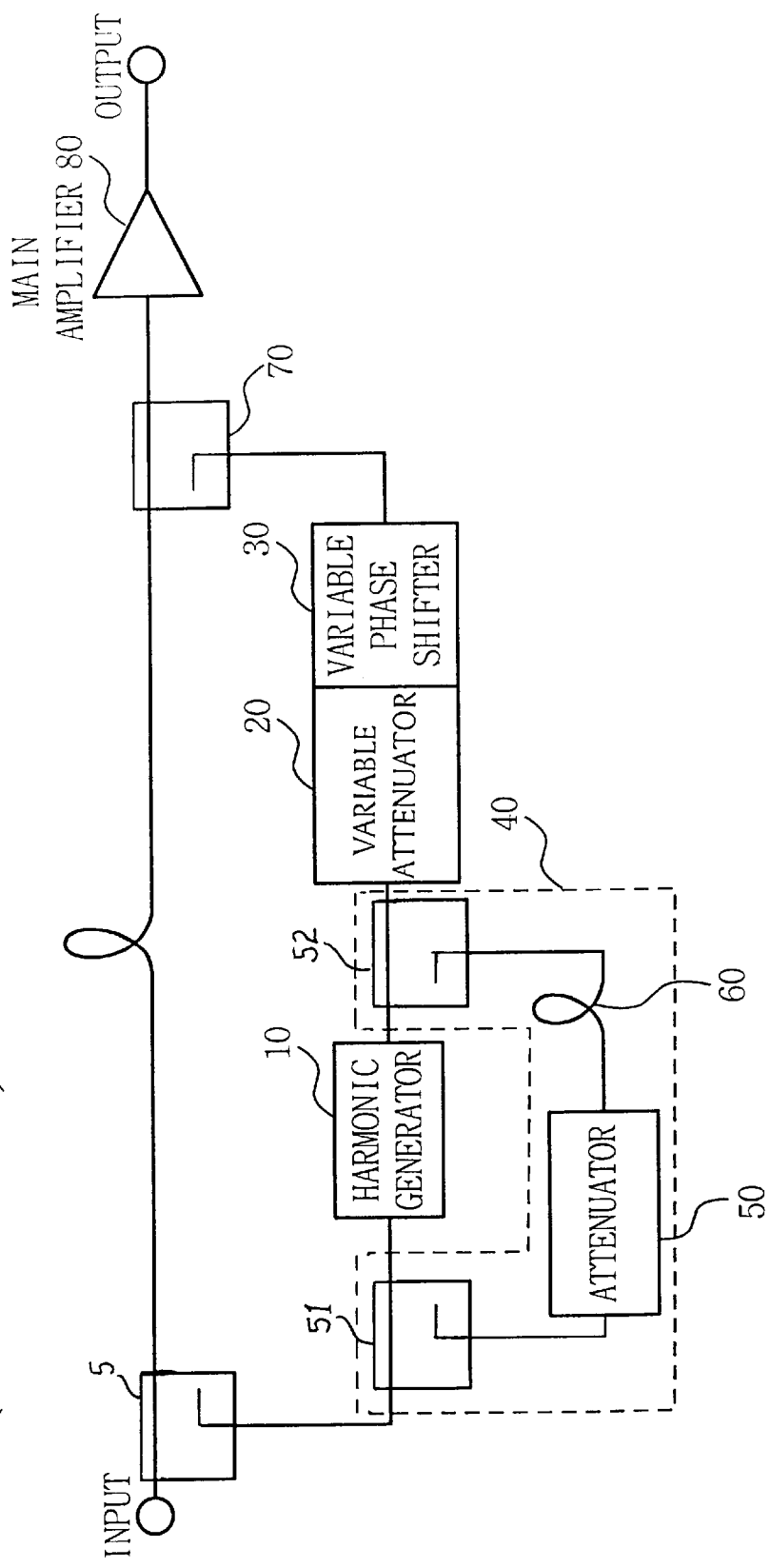
FIG. 1 illustrates a block diagram of a conventional predistorter in accordance with the prior art.
Figure 2:
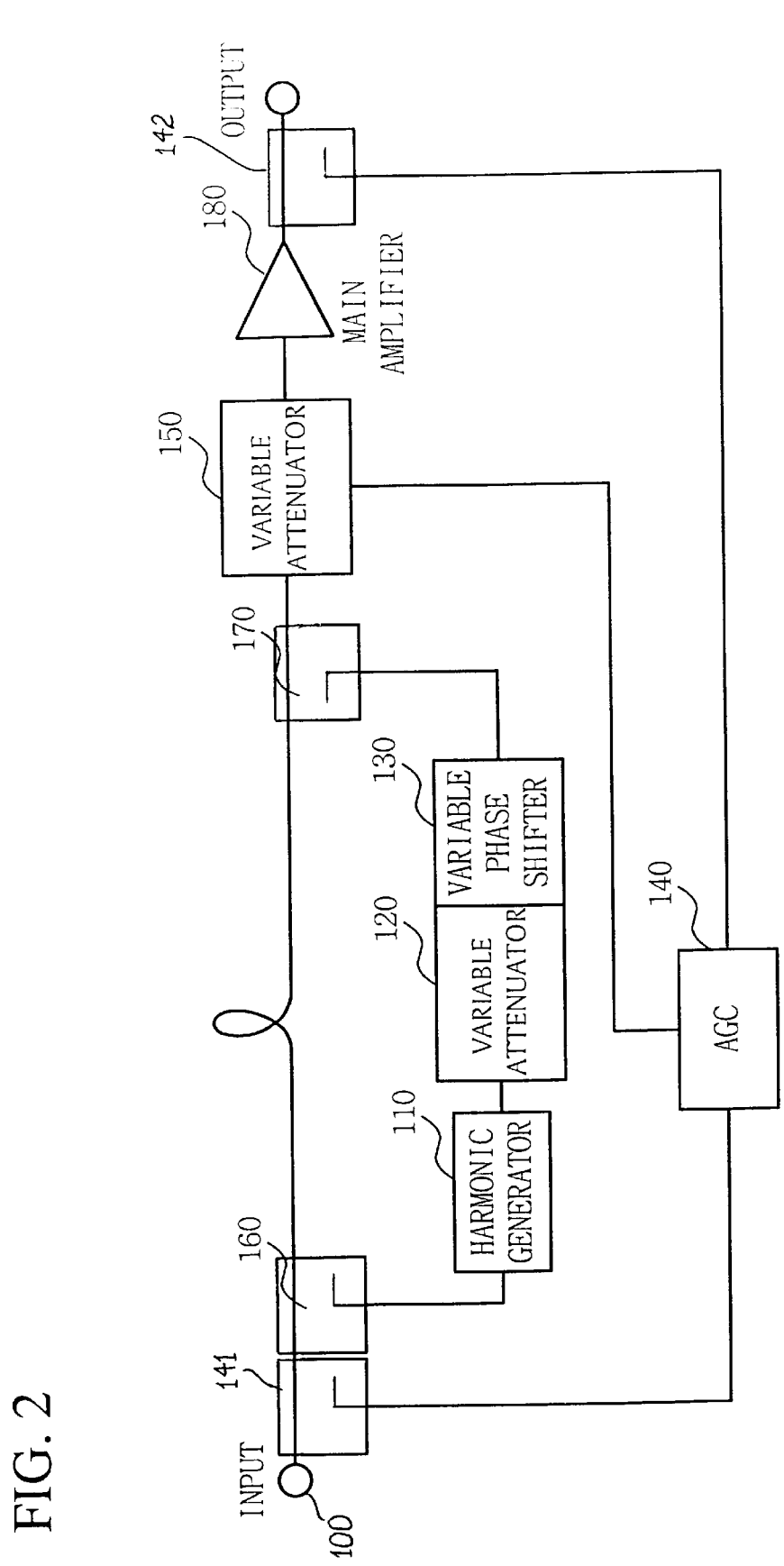
FIG. 2 illustrates a block diagram of a predistorter in accordance with the present invention.

Referring to FIG. 2, the structure of a preferred embodiment of the present invention is described wherein a block diagram of an overall amplifier which includes a predistorter is illustrated. The predistorter includes a harmonic generator 110 for generating harmonic signals for predistortion; a variable attenuator 120 and a variable phase shifter 130 for obtaining an optimized harmonic so as to suppress an intermodulation distortion of the overall amplifier; an automatic gain controller 140 for maintaining a gain of the overall amplifier; a variable attenuator 150 being controlled by the automatic gain controller 140; and a combiner 170 for combining the harmonic signal generated from the harmonic generator 110 and a signal proceeding along a main-path. Here, the signal proceeding along the main path is an input signal which passes through a phase shifter.

In operation, the overall amplifier, as described above, first separates a part of the input signal into the main path and the sub-path using a divider 160 and then generates a signal with spurious components using the harmonic generator 110. The harmonic generator 110 outputs the main path signal together with the signal with spurious components.

The signals outputted from the harmonic generator 110 are changed in magnitude and phase by the variable attenuator 120 and a variable phase shifter 130 such that the intermodulation distortion of the main amplifier 180 is minimized. The signal is combined with the main signal by the combiner 170.

The generated spurious component signal, among the signals outputted from the harmonic generator, is used to cancel the intermodulation distortion of the main amplifier 180, and the main carrier components partially determine the gain of the overall amplifier.

Accordingly, the gain of the overall amplifier is changed and the output of the main amplifier 180 is also changed. When the output of the main amplifier is changed, the output monitor signal of the automatic gain controller 140 is changed as a result and the automatic gain controller 140 simultaneously restores the gain of the overall amplifier to its original value by comparing an input signal 100 sampled from divider 141, with the output of the main amplifier 180, sampled from divider 142, and adjusting the variable attenuator 150 accordingly.

Consequently, it is possible to cancel the intermodulation distortion without having influence on the gain of the overall amplifier even though the variable attenuator 120 and the variable phase shifter 130 are adjusted in order to minimize the intermodulation distortion of the main amplifier 180.

FIG. 3 illustrates a flow chart of a method of predistortion using an automatic gain control circuit for a linearizer of a high frequency amplifier in accordance with the present invention, comprising the steps of: dividing an input signal into a main-path signal and a sub-path signal in step 10; delaying a phase of the main-path signal in step 20; generating harmonic signals using the sub-path signal in step 30; regulating a phase and an amplitude of an output signal of a harmonic generator in step 40; combining the regulated signal and the delayed main-path signal in step 50; amplifying and outputting the combined signal in step 60; comparing the input signal with the amplified combined output signal in step 70; and controlling an overall gain of the high frequency amplifier using the automatic gain control circuit when a change is detected in the amplified combined output signal during comparison with the input signal in step 80.

In the present invention, it is preferable that the step of controlling the overall gain of the high frequency amplifier comprises the steps of: minimizing the variation of a gain of the combined signal using the automatic gain control circuit to control a variable attenuator; and amplifying and outputting the combined signal so that an intermodulation distortion is suppressed, the variation of the gain of the combined signal being minimized by the control of the automatic gain control circuit.

The present invention has many advantages in that it is easy to manufacture the predistortion circuit simply by canceling the subtraction circuit, and there is no change in the gain of the overall amplifier when using the automatic gain control circuit, even when the variable attenuator and variable phase shifter are operated.

While specific embodiments of the invention have been shown and described in the specification and drawings in detail, it should be apparent to one skilled in the art that various modifications of the invention may be practiced without diverging from the spirit and scope of the invention as defined by the appended claims.

What is claimed is:

1. A predistorter of a high frequency amplifier, comprising:

an automatic gain control circuit for controlling an overall gain of said high frequency amplifier so that there is no change in the overall gain of said high frequency amplifier when an output signal is changed as a result of comparing an input signal to the output signal;

a variable attenuator being controlled by said automatic gain control circuit so that there is no change in an overall gain of said high frequency amplifier; thereby minimizing the change of gain of a combined signal; and a linearizer; said linearizer comprising:
      a signal divider for dividing the input signal into a main-path signal and a sub-path signal;
      a phase shifter for delaying the phase of said main-path signal;
      a harmonic generator for generating harmonic signals derived from said sub-path signal;
      a variable attenuator for attenuating an output signal of said harmonic generator;
      a variable phase amplifier for amplifying a phase of an output signal of said first variable attenuator;
      a combiner for combining an output signal of said variable phase amplifier with an output signal of said phase shifter; and
      a main amplifier for amplifying said combined signal.

2. A method of predistortion using an automatic gain control circuit for a linearizer of a high frequency amplifier, comprising the steps of:

dividing an input signal into a main-path signal and a sub-path signal;

delaying a phase of said main-path signal;

generating harmonic signals with a harmonic generator, the harmonic signals being derived from said sub-path signal;

regulating a phase and an amplitude of an output signal of said harmonic generator;

combining the regulated output signal and the delayed main-path signal;

amplifying and outputting the combined signal;

comparing said input signal with said amplified combined output signal; and controlling an overall gain of said high frequency amplifier using said automatic gain control circuit when a change is detected in the amplified combined output signal, said change being detected during comparison with the input signal.

3. The method as recited in claim 2, wherein said step of controlling an overall gain of the high frequency amplifier comprises the steps of:

minimizing a variation of a gain of said combined signal using said automatic gain control circuit; and amplifying and outputting said combined signal so that an intermodulation distortion is suppressed, wherein the variation of gain of said amplified combined output signal is minimized by the control of said automatic gain control circuit.

4. The method as recited in claim 3, wherein said automatic gain control circuit minimizes the variation of said gain by controlling a variable attenuator, which attenuates said combined signal in response to said automatic gain control circuit.

* * * * *